United States Patent
Liu et al.

(10) Patent No.: US 7,990,713 B2
(45) Date of Patent: Aug. 2, 2011

(54) HEAT DISSIPATION DEVICE AND METHOD FOR MANUFACTURING THE SAME

(75) Inventors: Xin-Lei Liu, Shenzhen (CN); Jin-Biao Liu, Shenzhen (CN); Hong-Cheng Yang, Shenzhen (CN); Chun-Chi Chen, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 79 days.

(21) Appl. No.: 12/500,615

(22) Filed: Jul. 10, 2009

(65) Prior Publication Data

US 2010/0246127 A1 Sep. 30, 2010

(30) Foreign Application Priority Data

Mar. 31, 2009 (CN) .......................... 2009 1 0301251

(51) Int. Cl.
*H05K 7/20* (2006.01)
*F28D 15/00* (2006.01)
(52) U.S. Cl. .................................. 361/700; 165/104.33
(58) Field of Classification Search .................... 361/700
See application file for complete search history.

(56) References Cited

U.S. PATENT DOCUMENTS

| 6,125,035 | A  | * | 9/2000 | Hood et al. | ............ | 361/679.47 |
|---|---|---|---|---|---|---|
| 6,301,107 | B1 | * | 10/2001 | Lev et al. | ................ | 361/679.52 |
| 6,304,441 | B1 | * | 10/2001 | Han | ........................ | 361/679.48 |
| 6,352,103 | B1 | * | 3/2002 | Chu et al. | ..................... | 165/80.3 |
| 6,359,780 | B1 | * | 3/2002 | McMahan et al. | ....... | 361/679.47 |
| 7,701,719 | B2 | * | 4/2010 | Chen et al. | .................... | 361/700 |
| 7,710,724 | B2 | * | 5/2010 | Takeguchi et al. | ........... | 361/700 |
| 7,782,617 | B2 | * | 8/2010 | Li et al. | ......................... | 361/700 |
| 2002/0195232 | A1 | * | 12/2002 | Katsui | ..................... | 165/104.33 |
| 2007/0253769 | A1 | * | 11/2007 | Hwang et al. | ................. | 403/326 |
| 2007/0274049 | A1 | * | 11/2007 | Lin et al. | ....................... | 361/704 |
| 2008/0198550 | A1 | * | 8/2008 | Wang et al. | ................... | 361/700 |
| 2009/0014160 | A1 | * | 1/2009 | Hsiao | ............................. | 165/121 |

* cited by examiner

*Primary Examiner* — Gregory D Thompson
(74) *Attorney, Agent, or Firm* — Frank R. Niranjan

(57) ABSTRACT

A heat dissipation device for dissipating heat from an electronic component mounted on a printed circuit board, includes a fin unit, a centrifugal fan located adjacent to the fin unit, a heat-conducting board attached to the electronic component and a heat pipe thermally connecting the fin unit and the electronic component. An engaging portion protrudes upwardly from a top face of the heat-conducting board. The heat pipe has an evaporating section extending through the engaging portion and being fixed to the top face of the heat-conducting board, and a condensing section attached to the fin unit.

17 Claims, 3 Drawing Sheets

HEAT DISSIPATION DEVICE AND METHOD FOR MANUFACTURING THE SAME

BACKGROUND

1. Technical Field

The disclosure generally relates to heat dissipation devices and, more particularly, to a heat dissipation device incorporating heat pipes, and method for manufacturing the same.

2. Description of Related Art

With the fast development of electronic industry, advanced electronic components such as CPUs (central processing units), or GPUs (graphics processing units) are being made with ever faster operating speeds. In addition, successive new models of mobile computers, such as notebook computers, are continuing to shrink in size and become lighter, smaller and thinner. Thus, with the improvement of the functionality of the notebook computers, heat generated from CPUs, GPUs, disk drives, power supplies and other components of the notebook computers is often increased. Greater emphasis is now being laid on increasing the efficiency and effectiveness of heat dissipation devices so as to keep operational temperature of the electronic components within a suitable range.

Nowadays, heat pipes, which operate by phase change of working liquid sealed therein, have been widely used due to their excellent heat transfer properties. Accordingly, heat dissipation devices equipped with heat pipes appear in many current applications and are widely used, with optimal performance thereof towards a common goal in current R & D efforts.

However, since the notebook computers are continuing to shrink in size and become thinner, a distance between the heat-generating components within the notebook computer and a shell of the notebook computer becomes smaller and smaller. It is difficult to dissipate heat generated from the heat-generating components effectively, particularly, to ensure a temperature of the heat-generating components within a safe threshold level.

What is needed, therefore, is a heat dissipation device incorporating heat pipes with enhanced heat dissipation performance.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
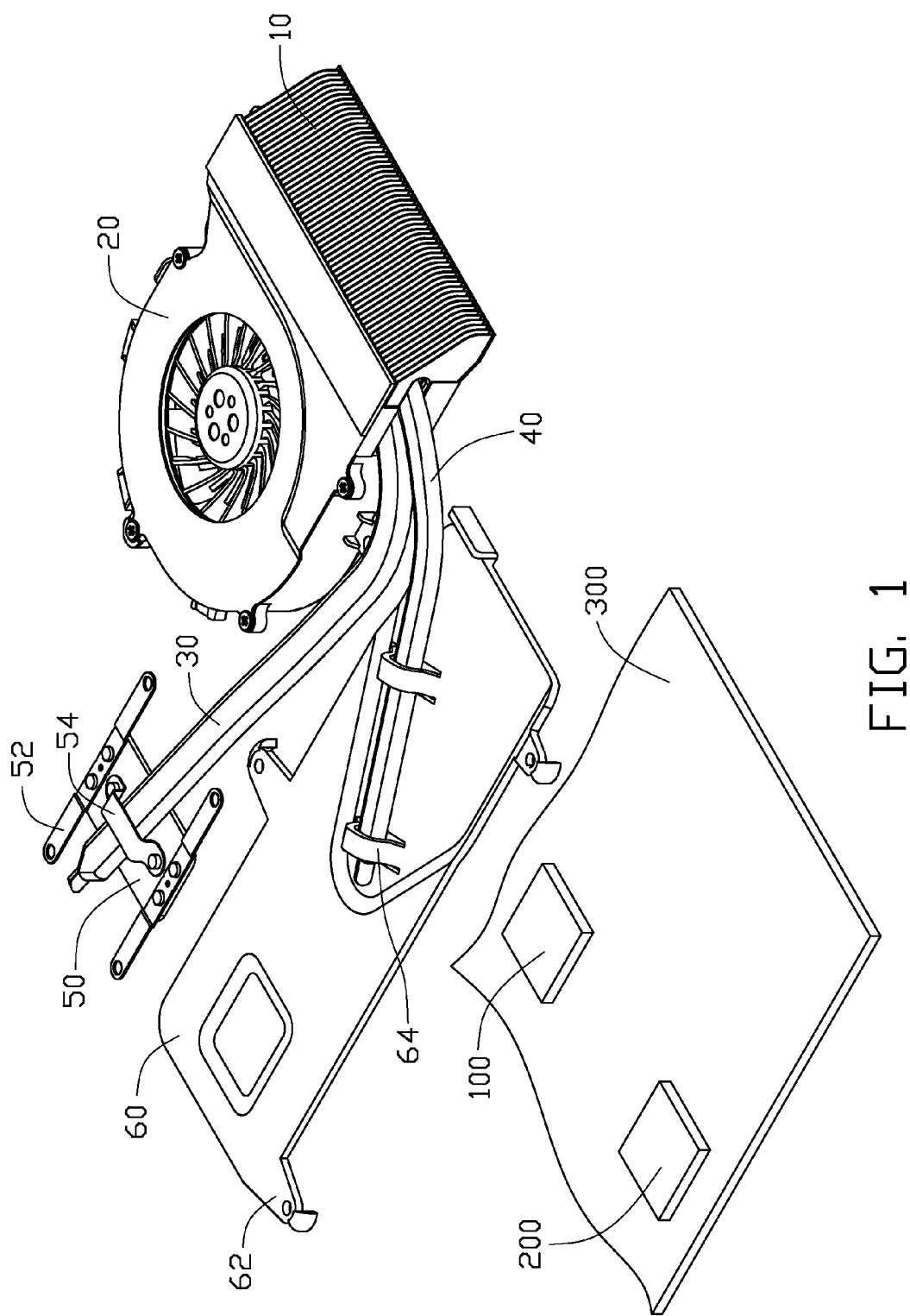
FIG. 1 is an assembled, isometric view of a heat dissipation device in accordance with an embodiment of the disclosure, with a printed circuit board and electronic components positioned on the printed circuit board.
Figure 2:
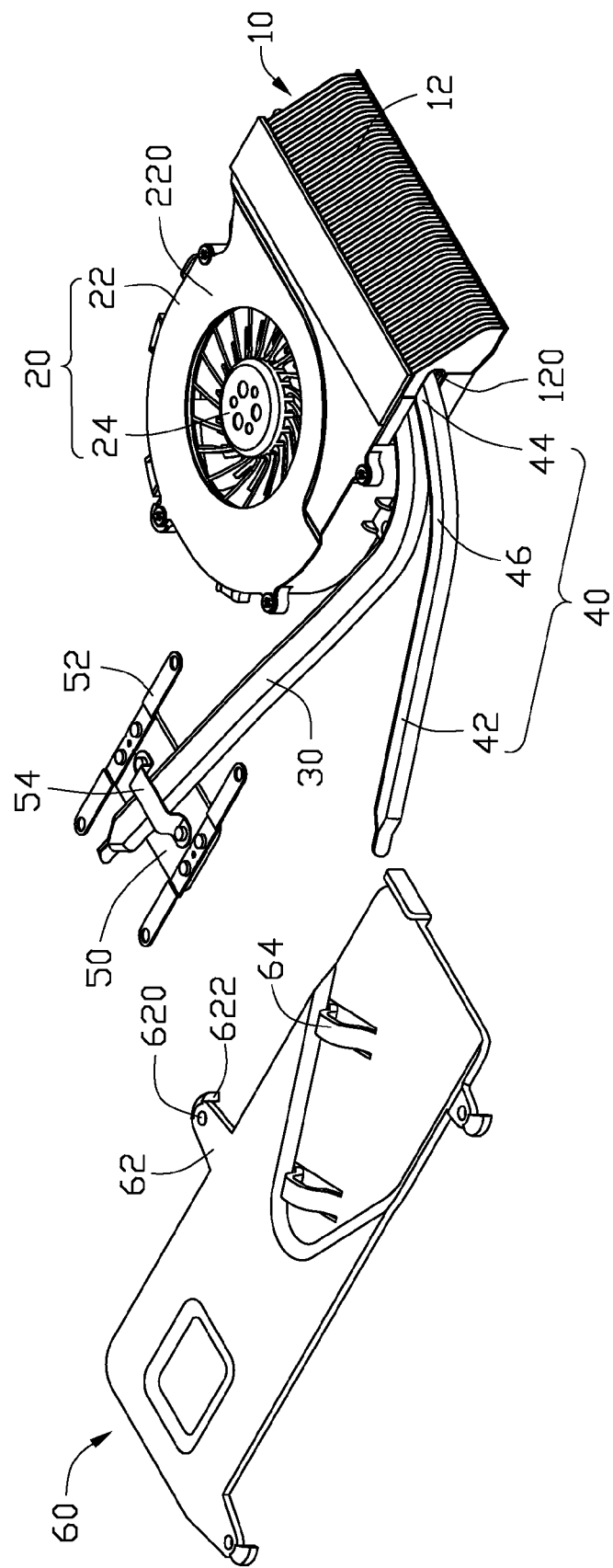
FIG. 2 is an exploded view of the heat dissipation device of FIG. 1.

Referring to FIGS. 1-2, a heat dissipation device in accordance with an embodiment of the disclosure dissipates heat from a first electronic component 100 such as a CPU (central processing unit) and a second electronic component 200 such as a GPU (graphics processing unit) simultaneously, which are arranged on a printed circuit board 300. The heat dissipation device comprises a fin unit 10, a centrifugal fan 20 located adjacent thereto, a first heat pipe 30 and a second heat pipe 40 thermally connecting with the fin unit 10, a first heat-conducting board 50 thermally attached to the first electronic component 100, and a second heat-conducting board 60 thermally attached to the second electronic component 200. The heat pipes 30, 40 connect the heat-conducting boards 50, 60 and the fin unit 10, respectively.

The fin unit 10 comprises a plurality of fins 12, each of which consist of an upright sheet body and a pair of flanges bent horizontally from a top and a bottom of the sheet body and engaging with the sheet body of an adjacent fin 12. Every two adjacent fins 12 form a passage therebetween for allowing airflow therethrough. An elongated receiving groove 120 is defined at a lateral side of the fin unit 10 facing the centrifugal fan 20, for accommodating parts (i.e. condensing sections) of the heat pipes 30, 40 therein. The receiving groove 120 extends transversely and perpendicularly through the fin unit 10.

Figure 3:
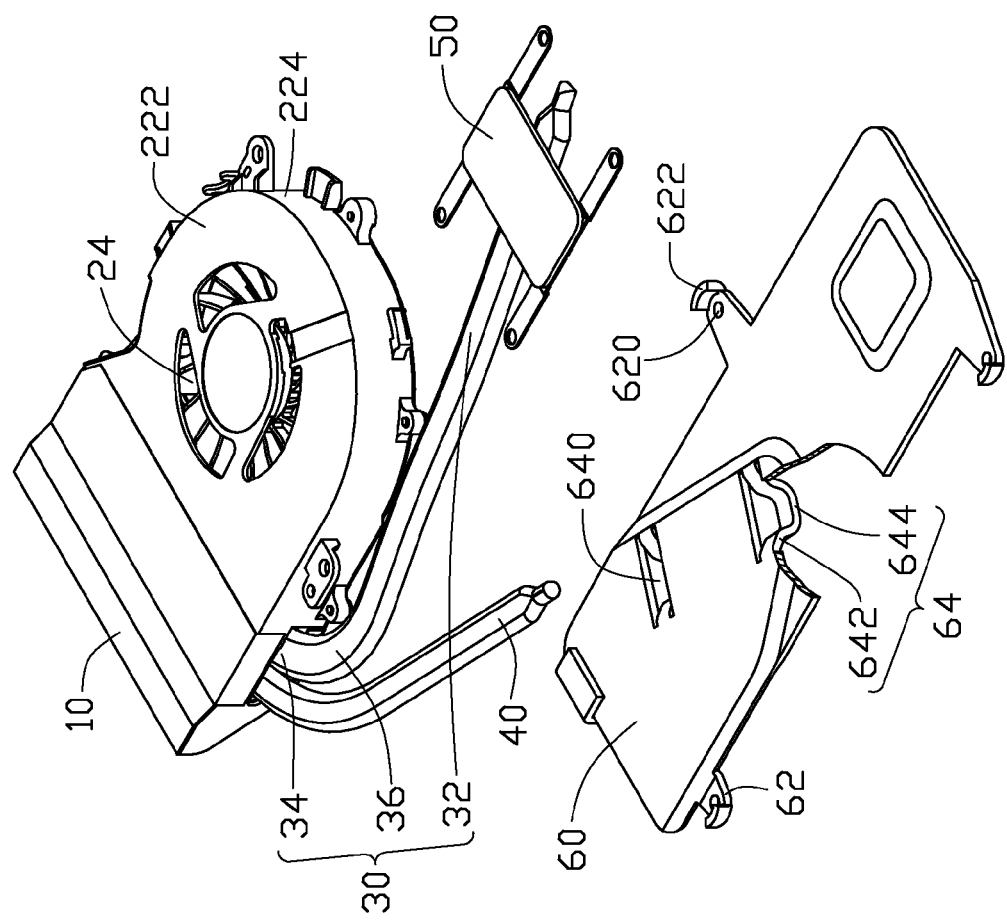
FIG. 3 is an inverted, exploded view of the heat dissipation device of FIG. 1, with a part of the heat dissipation device being cut off for clarity.

Referring to FIG. 3 also, the centrifugal fan 20 comprises a housing 22 engaging with the fin unit 10 and an impeller 24 rotatably disposed in the housing 22. The housing 22 comprises a top plate 220, a bottom plate 222 located opposite to the top plate 220 and a volute sidewall 224 extending upwardly from an outer periphery of the bottom plate 222 and fixed to the top plate 220. Each of the top plate 220 and the bottom plate 222 defines a through hole at a center thereof functioning as an air inlet for the centrifugal fan 20. The top plate 220, the bottom plate 222, and the sidewall 224 cooperatively define a receiving space for receiving the impeller 24 therein. The sidewall 224 is a semi-closed structure and defines a rectangular air outlet at a lateral side of the housing 22. The fin unit 10 is partly received in the air outlet of the housing 22, and the passages of the fin unit 10 directly communicate with the air outlet.

The first heat pipe 30 comprises a straight first evaporating section 32, a straight first condensing section 34 and a bended first connecting section 36 interconnecting the first evaporating section 32 and the first condensing section 34. The first evaporating section 32 is thermally attached to the first heat-conducting board 50. The first condensing section 34 is thermally received in the receiving groove 120 of the fin unit 10. A bottom face and a top face of the first heat pipe 30 are planar.

The first heat-conducting board 50 is a rectangular plate, and made of a metal with good heat conductivity, such as aluminum, copper, or an alloy thereof. A bottom face of the first heat-conducting board 50 is correspondingly attached to the first electronic component 100. The first evaporating section 32 of the first heat pipe 30 is mounted on a top face of the first heat-conducting board 50. Two mounting members 52 are further provided to the first heat-conducting board 50, for fixing the first heat-conducting board 50 to the printed circuit board 300. The two mounting members 52 are disposed at two opposite lateral sides of the first heat-conducting board 50, respectively. A tab 54 has two opposite ends fixed to the top face of the first heat-conducting board 50, and a middle portion spanning over and abutting against a top face of the first evaporating section 32 of the first heat pipe 30, thereby securing the first heat pipe 30 on the first heat-conducting board 50.

The second heat pipe 40 is similar to the first heat pipe 30, and comprises a straight second evaporating section 42, a straight second condensing section 44 and a bended second connecting section 46 interconnecting the second evaporating section 42 and the second condensing section 44. The second evaporating section 42 is thermally attached to the second heat-conducting board 60. The second condensing section 44 is thermally received in the receiving groove 120 of the fin unit 10 and located juxtaposed to the first condensing section 34 of the first heat pipe 30. A bottom face and a top face of the second heat pipe 40 are planar. The second heat pipe 40 is coplanar with the first heat pipe 30.

The second heat-conducting board 60 is an approximately rectangular plate, and made of a metal with good heat conductivity, such as aluminum, copper, or an alloy thereof. A bottom face of the second heat-conducting board 60 is correspondingly attached to the second electronic component 200. A plurality of spaced mounting arms 62 extending outwardly and horizontally from an outer periphery of the second heat-conducting board 60. Each of the mounting arms 62 defines a mounting hole 620 at a center thereof, for a screw (not shown) extending therethrough to mount the second heat-conducting board 60 on the printed circuit board 300. A positioning hook 622 is bent downwardly from a distal end of each mounting arm 62 to locate the second heat-conducting board 60 at a desired position. Two spaced arch-shaped engaging portions 64 protrude upwardly from a top face of the second heat-conducting board 60. The two engaging portions 64 are parallel to each other. The two engaging portions 64 extend inclinedly relative to peripheral sides of the second heat-conducting board 60. Each of the two engaging portions 64 comprises a pressing section 644 located above the second heat-conducting board 60, and two bended connecting arms 642 interconnecting two opposite ends of the pressing section 644 and the second heat-conducting board 60, respectively. Each engaging portion 64 is integrally formed by stamping a corresponding part of the second heat-conducting board 60, whereby an elongated stamping hole 640 is formed in the second heat-conducting board 60 corresponding to each engaging portion 64. The second evaporating section 42 of the second heat pipe 40 extends through the two engaging portions 64 and is sandwiched between the pressing sections 644 of the engaging portions 64 and the top face of the second heat-conducting board 60. In preassembled state, a distance between the pressing section 644 of the engaging portion 64 and the top face of the second heat-conducting board 60 is slightly more than a distance between the top face and the bottom face of the second evaporating section 42 of the second heat pipe 40, i.e. a height of the second evaporating section 42; a distance between the two connecting arms 642 of the engaging portion 64 is slightly more than a distance between two opposite lateral sides of the second evaporating section 42 of the second heat pipe 40, i.e. a width of the second evaporating section 42.

Referring to FIGS. 1 through 3 again, in assembly of the heat dissipation device, a tool is used to press the two connecting arms 642 of the engaging portion 64 downwardly, simultaneously; the pressing section 644 is driven by the downward movement of the two connecting arms 642 to move downwardly and abut against the top face of the second evaporating section 42 of the second heat pipe 40, thereby fixing the second evaporating section 42 to the second heat-conducting board 60 tightly and firmly.

In use of the heat dissipation device, the first and second electronic components 100, 200 generate a lot of heat. The heat is absorbed by the first and second heat-conducting boards 50, 60, then transferred by the first and second heat pipes 30, 40 to the fin unit 10, and finally dispersed into ambient air via the fin unit 10 in which airflow supplied by the centrifugal fan 20 flows through the fin unit 10, thereby preventing the electronic components 100, 200 from overheating.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A heat dissipation device adapted for dissipating heat from an electronic component mounted on a printed circuit board, the heat dissipation device comprising:
    a fin unit;
    a heat-conducting board for being attached to the electronic component; and
    a heat pipe thermally connecting the fin unit and the heat-conducting board;
    wherein an arched-shaped engaging portion protrudes upwardly from a top face of the heat-conducting board, the heat pipe extending through the engaging portion to be fixed to the top face of the heat-conducting board.

2. The heat dissipation device as claimed in claim 1, wherein the engaging portion comprises a pressing section located above the top face of the heat-conducting board and two bent connecting arms, the pressing section comprises two opposite ends, and each end of the pressing section connects the heat-conducting board through one of the bent connecting arms.

3. The heat dissipation device as claimed in claim 1, wherein the engaging portion is formed by stamping the heat-conducting board, whereby a through hole is defined in the heat-conducting board corresponding to the engaging portion.

4. The heat dissipation device as claimed in claim 1, wherein the engaging portion is extended inclinedly with respect to a peripheral side of the heat-conducting board.

5. The heat dissipation device as claimed in claim 1, wherein the heat pipe comprises an evaporating section attached to the heat-conducting board, a condensing section attached to the fin unit, and a bent connecting section interconnecting the evaporating section and the condensing section.

6. The heat dissipation device as claimed in claim 5, wherein a top face and a bottom face of the heat pipe are planar.

7. The heat dissipation device as claimed in claim 5, further comprising another heat-conducting board for being attached to another electronic component mounted on the printed circuit board, and another heat pipe thermally connecting the fin unit and the another heat-conducting board.

8. The heat dissipation device as claimed in claim 7, wherein the condensing section of the heat pipe and a condensing section of the another heat pipe are located juxtaposed to each other, the condensing section of the another heat pipe being attached to the fin unit.

9. The heat dissipation device as claimed in claim 7, wherein a centrifugal fan is located adjacent to the fin unit, and the centrifugal fan comprises a housing and an impeller rotatably disposed in the housing, and an air outlet is defined at a lateral side of the housing, and the fin unit is partly received in the air outlet.

10. The heat dissipation device as claimed in claim 9, wherein an elongated receiving groove is defined at a lateral side of the fin unit facing the air outlet of the centrifugal fan, the condensing sections of the heat pipe and the another heat pipe being accommodated in the receiving groove and thermally connected to a portion of the fin unit surrounding the receiving groove.

11. The heat dissipation device as claimed in claim 1, wherein a plurality of spaced mounting arms extend outwardly and horizontally from an outer periphery of the heat-conducting board, and each of the mounting arms defines a mounting hole at a center thereof.

12. The heat dissipation device as claimed in claim 11, wherein a positioning hook is bent downwardly from an end of each mounting arm to locate the heat-conducting board at a desired position.

13. A method for manufacturing a heat dissipation device adapted for dissipating heat from an electronic component mounted on a printed circuit board, the method comprising:
providing a planar heat-conducting board;
stamping the heat-conducting board to form an engaging portion protruding upwardly from a top face of the heat-conducting board, the engaging portion comprising a pressing section located above the top face of the heat-conducting board, and two bent connecting arms, the pressing section comprises two opposite ends, and each end of the pressing section connects the heat-conducting board through one of the bent connecting arms;
providing a heat pipe comprising an evaporating section extending through the engaging portion, a condensing section bent from the evaporating section, and a connecting section interconnecting the evaporating section and the condensing section;
pressing the two connecting arms of the engaging portion downwardly, thereby driving the pressing section to move downwardly and abut against the evaporating section of the heat pipe; and
providing a fin unit thermally engaging with the condensing section of the heat pipe.

14. The method as claimed in claim 13, further comprising providing another heat-conducting board attached to another electronic component mounted on the printed circuit board, and another heat pipe thermally connecting the fin unit and the another heat-conducting board.

15. The method as claimed in claim 13, wherein a distance between the pressing section of the engaging portion and the top face of the heat-conducting board is larger than a height of the evaporating section before the connecting arms are pressed.

16. The method as claimed in claim 13, wherein a distance between the two connecting arms of the engaging portion is larger than a width of the evaporating section before the connecting arms are pressed.

17. The method as claimed in claim 13, wherein a fan is located adjacent to the fin unit with the fin unit partially received in an air outlet of the fan.

* * * * *